United States Patent [19]
Morton et al.

[11] Patent Number: 6,075,727
[45] Date of Patent: Jun. 13, 2000

[54] METHOD AND APPARATUS FOR WRITING AN ERASABLE NON-VOLATILE MEMORY

[75] Inventors: Bruce Lee Morton, Austin, Tex.; Michel Bron, Lausanne, Switzerland; Alexis Marquot, Lanovaz, France; Graham Stout, Glasgow, United Kingdom

[73] Assignee: Motorola, Inc, Schaumburg, Ill.

[21] Appl. No.: 09/124,466

[22] Filed: Jul. 29, 1998

[51] Int. Cl.[7] .......................... G11C 16/06; G11C 16/04; G11C 7/00

[52] U.S. Cl. ................ 365/185.22; 365/185.29; 365/218

[58] Field of Search ................. 365/185.04, 185.18, 365/185.22, 185.29, 185.33, 218

[56] References Cited

U.S. PATENT DOCUMENTS

| | | | |
|---|---|---|---|
| 5,343,434 | 8/1994 | Noguchi | 365/185.04 |
| 5,579,262 | 11/1996 | Song | 365/185.33 |
| 5,777,923 | 7/1998 | Lee et al. | 365/185.18 |
| 5,889,701 | 3/1999 | Kang et al. | 365/185.22 |

FOREIGN PATENT DOCUMENTS

| | | |
|---|---|---|
| 0 283 238 B1 | 1/1995 | European Pat. Off. . |

OTHER PUBLICATIONS

"An ESD Protection Scheme for Deep Sub–Micron ULSI Circuits," Sharma, et al; 1995 Symposium on VLSI Technology; Jun., 1995/Kyoto; pp. 85–86.

"A Novel Technology for Megabit Density, Low Power, High Speed, NVRAMS," Sharma, et al.

"A 5V—Only 4K Nonvolatile Static Ram," Becker, et al; 1983 IEEE International Solid–State Circuits Conference; pp. 170–171.

Nozoe et al., "A 256–Mb Multilevel Flash Memory with 2–MB/s Program Rate for Mass Storage Applications," IEEE, pp. 1544–1550 (1999).

*Primary Examiner*—Trong Phan
*Attorney, Agent, or Firm*—James L. Clingan, Jr.

[57] ABSTRACT

A method for writing to a bit of a non-volatile memory (50) by alternately applying programming and erase voltages to a control gate wordline of a memory cell. A write includes programming and erasing bits (30, 31, . . . , 32, 33) in the memory array (56). Upon completion of the write operation a verify erase (VE) indication and a verify program (VP) indication are provided to a memory controller (58), which then determines if multiple cycles are necessary. The configuration of the memory cell allows isolation of each bit in the memory array to avoid effects of writes to neighbor bits. According to one embodiment, a three transistor EEPROM is written by providing a high voltage to the drain select of the selected wordline, while providing a low voltage to the drain select of other wordlines. Programming and erase voltages are applied to the control gate wordline of the selected wordline in cycles until the write is complete.

19 Claims, 7 Drawing Sheets

METHOD AND APPARATUS FOR WRITING AN ERASABLE NON-VOLATILE MEMORY

CO-PENDING RELATED APPLICATIONS

The present application is related to the following U.S. patent application:

"Non-volatile memory cell and methof for manu same", invented by Kevin Y. Wu, et al. having Attorney Docket No. SC-90918P, Ser. No. 09/124,592, filed concurrently herewith, and assigned to the assignee hereof.

FIELD OF THE INVENTION

The present invention relates in general to integrated circuit memory devices and specifically to a method and apparatus for writing to an erasable nonvolatile memory.

BACKGROUND OF THE INVENTION

Electrically erasable and programmable read-only memory (EEPROMs) are non-volatile memory devices which are programmed and erased using electrical signals. An EEPROM finds application in data processing systems when it is necessary to preserve changes made to memory during operation of the data processing system. In these situations the EEPROM maintains the state of the memory throughout a power down of the system.

An erasable non-volatile memory device typically contains many memory cells. A memory cell is a portion of the memory which holds one unit, or bit, of data. Typically, a memory cell includes at least one transistor or storage device. Memory cells are organized into groups, where a typical grouping is called a byte and includes eitght bits of data. Each group or byte may then be individually programmed. Each byte is identified by its position in the memory array, where each byte has a unique combination of wordline and bitline locations. The wordline and bitline information forms an effective address of the byte of memory, similar to the identification of entries in a mathematical array by row and column identification. Erasing is provided either for the entire memory array in bulk, for an individual wordline, for a group of wordlines, for an individual byte or for a group of bytes.

Identification of the wordline and bitline of a specific memory cell is typically provided by a wordline control and a bitline control. A typical EEPROM cell includes a floating gate transistor which is coupled to the wordline control and a select transistor which is coupled to the bitline control. The floating gate transistors store the digital value associated with the memory cell. For programming or erasing, the wordline control provides sufficient voltage to the floating gate transistor to allow programming or erasing. The select transistors select an individual EEPROM cell in the indicated wordline to be erased or programmed.

Figure 2:
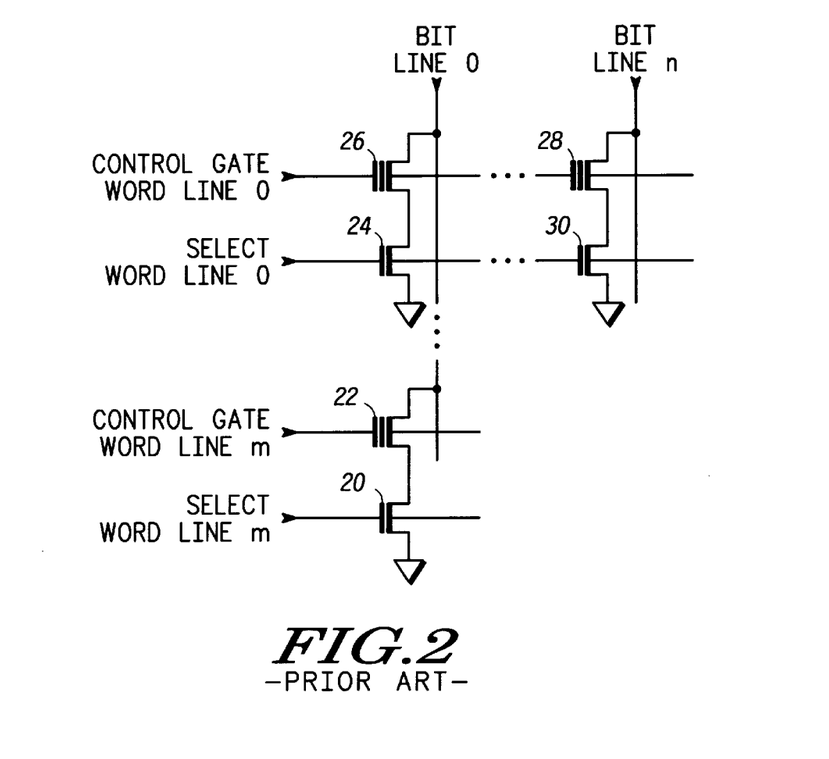
FIG. 2 illustrates, in circuit diagram form, a two-transistor source-select flash memory.

According to the erasure scheme of one memory embodiment illustrated in FIG. 2, the control associated with a given wordline is biased at a high positive voltage, such as 12 to 15 volts, while the bitlines are held at a lower reference potential, thus erasing the entire wordline, i.e. changing the charge stored on each floating gate transistor coupled to the control line to an erased state. The voltages are maintained on the control and select lines for a time period sufficient to allow erasing of each cell. It is therefore desirable to erase multiple cells concurrently and thus realize a reduction in total erase time. For EEPROM cells having separate select gates, the select gates are typically turned on during the erase operation, however this is not essential. At completion of the erase operation, the floating gate devices are charged to a threshold voltage which is sufficient to prevent conduction during a read operation. Any number of control lines may be biased simultaneously, allowing block and bulk erase. For block erase multiple rows in the memory array are erased at one time. For a bulk erase all rows are erased at the same time. Block and bulk erasing reduce the total time required to erase the memory array, as multiple cells are erased concurrently.

According to this embodiment, a memory cell is defined as erased when the floating gate device is in its non-conductive state, corresponding to a logical "0," and a memory cell is defined as programmed when the floating gate device is in its conductive state, corresponding to a logical "1." Note that alternate embodiments may define the memory cell using opposite polarity. During programming the control line is biased to a high negative voltage, such as −12 to −15 volts and the floating gate device is programmed to a conductive state. During the programming operation the associated bitline is then biased to a moderately high positive voltage with respect to the control line, such as 5 volts. A given row has a plurality of bitlines each corresponding to a bit in the row. Since the control line runs through multiple bits in a given row, it is desirable to isolate those bits that are to remain in an erased state and prevent programming. This is done by applying a bias voltage to the bitlines associated with bits that are not to be programmed. The biasing voltage is at ground or a low reference voltage level. Similarly, control lines for unselected rows are isolated by applying a bias voltage of about 3.5 volts. Biasing the unselected control lines minimizes any bitline disturbance or any band-to-band tunneling effects. Note that during programming, often neighboring bits are effected by the voltages used to program desired bits. This is true as neighboring bits are exposed to the same high voltages during programming.

One particular configuration of EEPROM is a flash EEPROM. Flash EEPROMs provide electrical erasing and programming capability and generally have an increased circuit density. This increased circuit density typically comes at the cost of only being able to block erase a flash EEPROM array. Typically, the array is erased in a single step or a "flash", and thus the term flash EEPROM. As circuit design dimensions continue to decrease, there is a need to maintain programming and erase voltages for these types of memories, without increasing the silicon area required to create and maintain these voltages. Typically, n-channel devices maintain a $V_{threshold}$ value which increases as the source terminal voltage of the transistor increases. For typically high erase and programming voltages, the n-channel threshold voltage introduces too great of a loss for efficient operation. This often requires additional circuitry to maintain the voltage necessary to write to the memory cells. The additional circuitry often is large relative to the size of the memory array. There is a need for a method of writing to non-volatile erasable memories which does not introduce the disturbance effects on neighboring memory cells. Additionally, it is desirable that a method of writing to a memory is able to isolate individual bits within the memory array. Particularly in memories which have a very high number of write cycles, for example, greater than 100k write cycles, it is desirable to have a select device which effectively protects transistors sharing a common bitline during programming of other rows in the memory array.

DETAILED DESCRIPTION OF THE DRAWINGS

The previously mentioned needs are fulfilled and other advantages achieved with the present invention. In one form, the present invention provides a method of bit programming and bit erasing a memory array which reinforces those bits which are to remain in the same state. In one embodiment, a memory cell includes three transistors: a floating gate transistor, a source select transistor, and a drain select transistor. Programming of the floating gate transistor is effected by providing bitline voltages according to programming data and applying a programming voltage followed by an erase voltage to the control gate of the floating gate transistor. In another embodiment, the method verifies programming of bits to be programmed and provides programming cycles until programming is completed. In another embodiment, the method verifies erasure of bits to be erased and provides erase cycles until erasure is completed. According to one embodiment, a memory control state machine monitors the state of a verify erase bit (VE) and a verify program bit (VP) and provides additional programming and/or erase cycles in response. The present invention allows for programming and erase of non-volatile memory while minimizing the line to line disturbance tunnel effects induced in cells which are not selected to change data state.

According to one aspect of the present invention, a method for writing to a memory array, where the memory array has a plurality of rows, a plurality of bitlines, and a plurality of write latches corresponding to the plurality of bitlines, comprises the steps of selecting a first row in the memory array, the first row storing a first data; loading the first data from the first row into the plurality of write latches; modifying at least one of the write latches to implement a second data; supplying each of the plurality of bitlines with a voltage corresponding to the second data; applying a programming voltage to a control gate wordline coupled to the first row; and applying an erase voltage to the control gate wordline coupled to the first row.

According to another aspect of the present invention, an integrated circuit comprises a memory array having a plurality of rows, the plurality of rows having a plurality of memory cells; a write latch unit coupled to the memory array, the write latch storing data to be written into the memory array; a comparator coupled to the memory array and to the write latch unit, the comparator comparing data stored in a first row of the plurality of rows to data stored in the write latch unit and in response providing a verify erase signal and a verify program signal; a memory controller coupled to the memory array and the write latch unit, the memory controller initiating application of a programming voltage to a wordline coupled to the first row when the verify program signal is at a first value, the memory controller initiating application of an erase voltage to the wordline coupled to the first row when the verify erase signal is at a second value.

Figure 1:
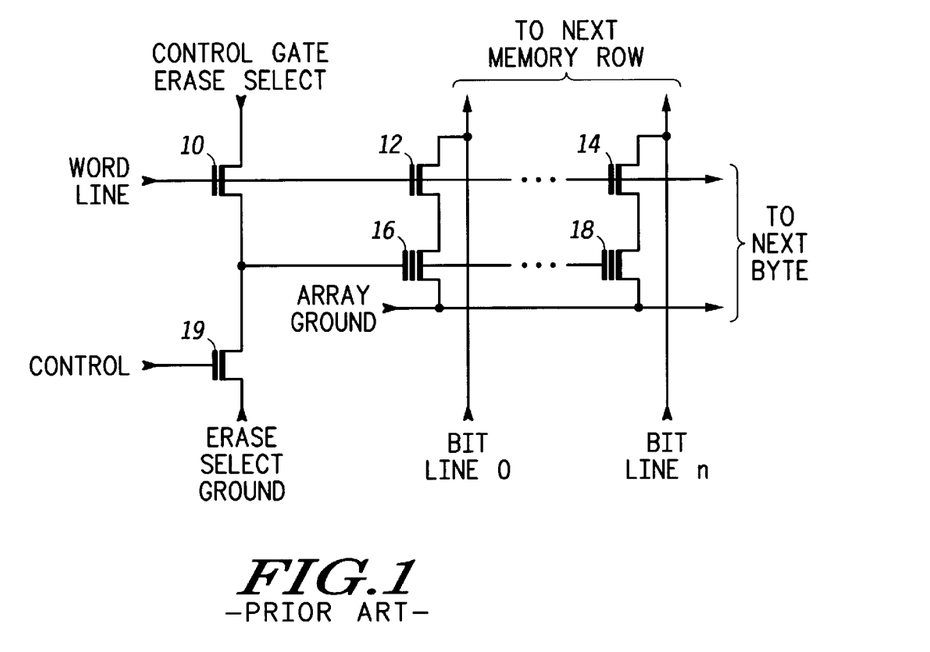
FIG. 1 illustrates, in circuit diagram form, a prior art implementation of a non-volatile memory cell having erase-select.

FIG. 1 illustrates a prior art implementation of an electrically erasable programmable read-only memory (EEPROM). According to this embodiment, a memory cell is in an erased state when it is non-conductive and holds the threshold voltage which represents a logical low value. A programmed memory cell is in a conductive state and holds the threshold voltage which represents a logical high value. In this embodiment, n is equal to eight, as there are eight bits per byte. Each bitline has an associated memory cell in each of the wordlines. The memory array includes memory cells from the first one, including transistors 12 and 16, to the last one, including transistors 14 and 18. Each memory cell in the array is identified by its wordline and bitline location.

A first memory cell includes transistor 12 and transistor 16. Transistor 12 is a drain select transistor used to couple the memory cell to the bitline. Transistor 12 includes a source node coupled to the drain node of transistor 16, and a drain node coupled to bitline 0. Transistor 16 is a floating gate transistor, used to store data. The source node of transistor 16 is coupled to an array ground voltage supply. The memory array is illustrated as having multiple bitlines labeled from 0 to n. Additional bytes of memory are similarly configured.

For programming and erasure of a byte in the memory array, a selection circuitry is implemented which includes transistors 10 and 19. Transistor 10 is an erase select transistor used to select transistors 16 through 18 for erase, and to isolate transistors 16 through 18 when this wordline is not selected. Transistor 19 is a program select transistor used to bias transistors 16 through 18 for programming. Other memory cells in the array have the same arrangement of floating gate transistor coupled to select transistor.

The wordline voltage is provided to the gate of transistors 10, and 12 through 14, and identifies these transistors as having a same wordline location. Each transistor coupled to this wordline is responsive to wordline control provided to the gate of transistor 10. A control gate erase select signal is provided to the drain node of transistor 10. As illustrated, the memory cells form a byte of memory having eight bits or eight memory cells. A control signal is provided to the gate of transistor 19. The source node of transistor 19 is coupled to an erase select ground voltage supply. The drain node of transistor 19 is coupled to the control gates of transistors 16 through 18. The control node is coupled to the control gate nodes of floating gate transistors 16 through 18. Transistors 16 through 18 are then coupled to transistors 12 through 14, respectively. Transistors 12 through 14 are then coupled to bitlines 0 through n, which continue to a next memory wordline. Transistors 14 and 18 are coupled to the next byte of memory.

In erasing a byte of the memory illustrated in FIG. 1, again we select a row by asserting the wordline. A high voltage is then supplied via control gate erase select to transistor 10, while bitlines 0 through n are maintained at a lower voltage. The high voltage supplied by control gate erase select erases transistors 16 through 18. According to this embodiment, all transistors in the byte of memory defined by the asserted wordline and bitlines 0 through n are erased.

The byte of memory illustrated in FIG. 1 includes bits 0 through n, where bitline 0 is coupled to transistor 12 and bitline n is coupled to transistor 14. In programming the memory illustrated in FIG. 1, first a wordline is selected. The selected wordline is indicated by asserting a voltage corresponding to the wordline, i.e. providing a high negative voltage on the wordline. The data to be programmed to bits 0 through n of the selected wordline is applied as corresponding voltages to bitlines 0 through n. While programmed the data is stored in transistors 16 through 18. As discussed above, for a high logical data value, i.e. one, the corresponding bit is placed into a conductive state and defined as a programmed bit. For a low logical data value, i.e. zero, the corresponding bit is placed into a non-conductive state and defined as an erased bit.

During programming, it is important that the control node coupled to the control gate of transistor 16 through 18 is maintained at a ground reference level, typically 0 volts. To accomplish this, either control gate erase select provides a ground reference voltage through transistor 10, or as is more commonly done, a high voltage is provided via the gate of transistor 19 to turn on transistor 19 with ground reference voltage provided via erase select ground. In this way, the erase select ground voltage is provided to the control gate of transistors 16 through 18 during programming mode.

Note that the memory illustrated in FIG. 1 is applicable for byte program and erase. Size becomes an issue as circuit designs shrink to implement smaller technologies. Erase speed is increased using higher erase voltages, and smaller technologies have difficulty handling the increased voltage. The threshold voltage associated with these devices becomes untenable, as the voltage loss is proportionally greater at lower voltages. The problem may be resolved by implementation of p-channel and n-channel devices. However, the resultant circuitry is too large for efficient application.

FIG. 2 illustrates a source-select implementation of a two-transistor flash memory. The portion of the memory array illustrated includes transistors 26 through 28, respectively coupled to transistors 24 through 30, which are associated with wordline 0. Similarly, the array includes a plurality of bitlines, where bitline 0 is associated with transistors 26 and 22, respectively coupled to transistors 24 and 20. In this memory device, data is stored in transistors 26 through 28, and transistor 22, which are floating gate transistors. Note that transistor 22 is associated with wordline m, and there are transistors associated with bitlines 1 through n on wordline m which are not illustrated. Here wordline 0 is selected for reading by asserting the select wordline voltage, and each bit within wordline 0 by selecting for sensing the bitline associated with that bit. For example, to read the bit identified at transistor 26, select wordline 0 is asserted while control gate wordline 0 is biased to a predetermined reference voltage, and the data to be read is indicated by the conductances to ground from bit line 0. Similarly, wordline m is read by asserting the voltage on wordline m and the data stored in transistor 22 is indicated by the conductance of bitline 0 to ground. Each of transistors 26 through 28 and 22 has an associated select transistor, which acts as a switch. The gate of transistors 24 through 30 is accessed by assertion of select wordline 0. Each of transistors 24 through 30 and transistor 20 are then coupled to a common array ground.

Programming of the memory device illustrated in FIG. 2 is accomplished by providing a high voltage on bitlines associated with the bits to be programmed and providing a lower voltage via the control gate wordline to the associated control gate wordline. For example, programming of transistor 26 is accomplished by providing a high voltage on bitline 0 and providing a low voltage on control gate wordline 0. Typically, bitline 0 will be held at 5 volts during programming and control gate wordline 0 at −12 volts. During programming, all select gate wordlines will be held at approximately reference ground or 0 volts. Note that this configuration allows a voltage potential drop of approximately 17 volts across the transistor to be programmed.

Note that during programming of transistor 26, transistor 28 also receives the control gate wordline 0 voltage of −12 volts. This causes a disturbance to transistor 28. If transistor 28 has been programmed, then the control gate wordline 0 voltage acts to reinforce the programming on transistor 28 and introduces no undesirable disturbance. However, a problem arises if transistor 28 is in an erased state; in this case application of a programming voltage, −12V, to control gate wordline 0 to program transistor 26 has a disturbing effect on the erased state of transistor 28.

During erase of transistor 26, a high voltage is provided via control gate wordline 0 and a low voltage via bitline 0. Note that the high voltage on control gate wordline 0 is also provided to the transistors 26 through transistor 28. Alternately, a high voltage could be provided to select wordline 0, turning on transistor 24 and providing common array ground value as a source to transistor 26. In this way, transistor 26 is also erased. In an alternate method, both bitline 0 is held to a low voltage and select wordline 0 is held to a high voltage. Programming and erase of transistors 26 through 28 and transistor 22 are accomplished in a similar manner.

As another example, a row erase of the memory cell of FIG. 2 may also be accomplished by biasing the control gate wordline to a high positive voltage, such as 15 volts. All bitlines are then held at a ground potential. Select gates are typically turned on, however this is not essential. Floating gate devices, which are biased high via the control gate wordline 0 become charged, resulting in threshold voltages sufficient to prevent conduction during a memory read mode. Any number of control gate wordlines may be biased together, permitting block or bulk erase under these conditions.

Similarly, during programming the control gate wordline is biased to a high negative voltage while the associated bitline is biased to a moderately high positive voltage. Bits coupled to the same gate wordline, but not intended for programming are biased to a ground voltage. Unselected control gate wordlines are biased to around 3.5 volts to minimize bitline disturbance and band-to-band tunneling effects. Here a neighboring bit is subject to gate disturbance due to exposure to the negative voltage. If the bit programs before the neighbor is corrupted, the program is successful, however, often a problem arises where the neigbor is corrupted before full programming is complete. In these type operations, it generally is necessary to perform a bulk erase prior to programming.

Figure 3:
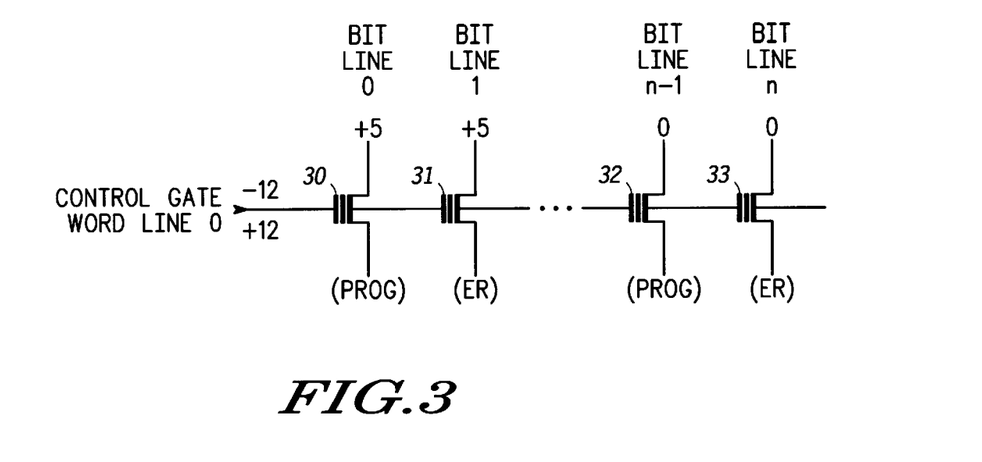
FIG. 3 illustrates, in circuit diagram form, a portion of a memory array according to one embodiment of the present invention.

PIG. 3 illustrates a portion of a memory device, according to one embodiment of the present invention, which provides biasing conditions sufficient to program or erase a bit without the use of bulk or block erase operations to store a logical low value in the bit to be erased. Indicated below each transistor is the state prior to programming where, for example, transistors 30 and 32 were in a programmed state and transistors 31 and 33 were in an erased state. During programming, the control gate wordline voltage is toggled between a negative voltage, such as approximately −12 volts, and a high voltage, such as approximately +12 volts, for writes to memory cells 30, 31 through 32, and 33. Prior to the write operation, transistors 30 and 32 were in a conductive state, i.e. programmed, while transistors 31 and transistor 33 were in a non-conductive state, i.e. erased. Note that bitline 0 is coupled to transistor 30, bitline 1 is coupled to transistor 31, bitline n–1 is coupled to transistor 32, and bitline n is coupled to transistor 33. Control gate wordline 0 is coupled to a control gate or floating gate of transistors 30, 31, through 32 and 33. According to the example illustrated in FIG. 3, predetermined data is to be written into transistors 30 through 33. Transistor 30 is to be programmed, transistor 31 is to be programmed, transistor 32 is to be erased, and transistor 33 is to be erased. To effect this write into these transistors, bitline 0 and bitline 1 are held at 5 volts and bitline n–1 and bitline n at 0 volts. A programming voltage is applied to control gate wordline 0 for a first time period and an erase voltage is supplied to control gate wordline 0 for a second time period.

Figure 4:
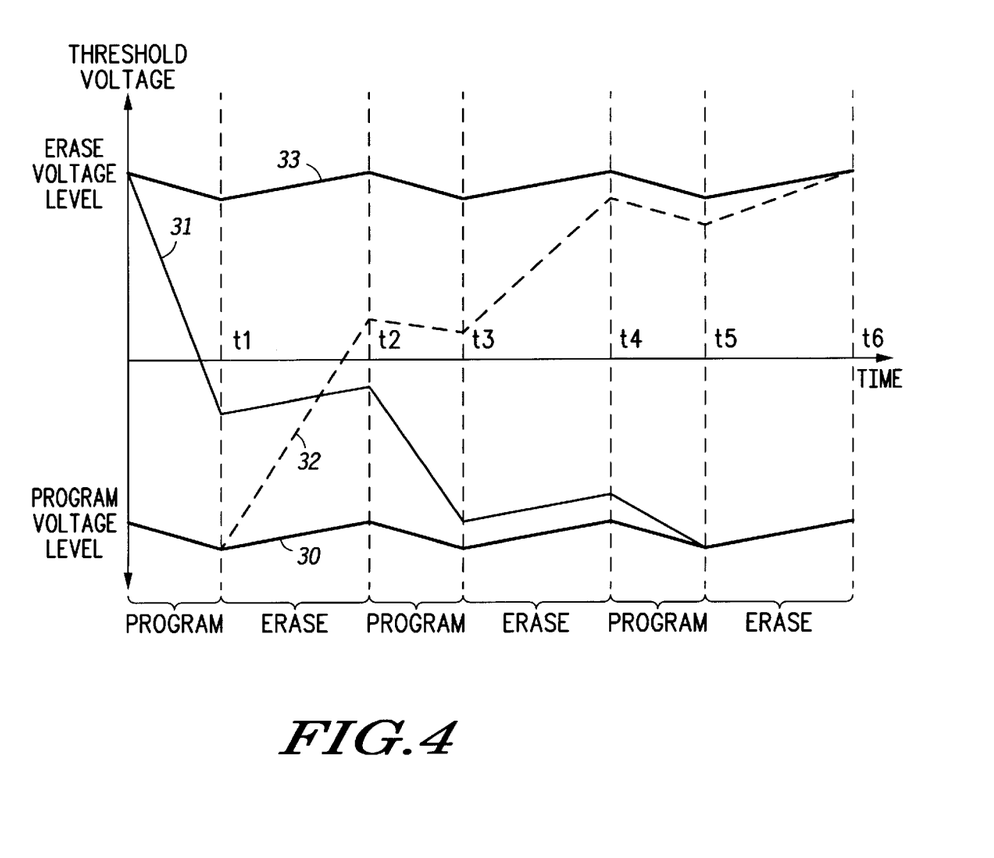
FIG. 4 illustrates, in timing diagram form, a timing diagram corresponding to a method of writing to a memory according to one embodiment of the present invention.

The result evidenced in the circuit is illustrated in the timing diagram of FIG. 4, where the horizontal axis corresponds to time and the vertical axis corresponds to threshold voltage. The threshold voltage of each of floating gate transistors 30 through 33 is illustrated and marked accordingly. Here an erase margin voltage level and a program margin voltage level are indicated on the threshold voltage axis. Additionally, time periods t1, t2, t3, t4, t5, and t6 are indicated on the time axis. During the first time period, which ends at time t1, a programming voltage is applied to control gate wordline 0. As discussed above, transistor 30 was programmed prior to the write operation, therefore transistor 30 was at the program threshold voltage level. As programming voltage was applied to control gate wordline 0, there was a resultant effect on transistor 30 to reinforce the programming, thus driving the threshold voltage on transistor 30 below the programming threshold voltage level. Any threshold voltage below a predetermined program margin threshold voltage level allows conduction and therefore will be read as a programmed cell. Any threshold voltage above a predetermined erase margin threshold voltage level prevents conduction and therefore will be read as an erased cell. As the threshold voltage on transistor 30 falls below the program margin threshold voltage level, there is no negative disturbance to the data stored in transistor 30.

During the next time period beginning at time t1 and ending at time t2, an erase voltage is applied to the control gate wordline 0 resulting in an increase in the threshold voltage on transistor 30. The erased voltage is provided during this time period, but is not sufficient to raise the threshold voltage on transistor 30 above the original program threshold voltage level. As the voltage on the control gate wordline toggles between a programming voltage and an erase voltage, the threshold of transistor 30 rises and falls, but remains at or below the program threshold voltage level.

A difference occurs with respect to transistor 31, which begins at an erase threshold voltage level prior to the write operation. At the end of time period t1, as illustrated in FIG. 4, the threshold voltage on transistor 31 has fallen well below the erase threshold voltage level, and is approaching the program threshold voltage level. During the next time period an erase voltage is applied, resulting in a slight increase in the threshold voltage of transistor 31, however, on the next cycle a programming voltage is applied and the threshold voltage continues toward the program margin threshold voltage level. By time t5 transistor 31 appears to be in the programmed, conductive, state similar to transistor 30.

Transistor 32 acts in a similar manner to transistor 30 with the programming threshold voltage reinforced as the programming voltage is applied to control gate wordline 0. However, when the erase voltage is applied during the next time period, the threshold voltage of transistor 32 approaches the erase margin voltage level. On the next cycle of programming voltage, beginning at time t2 and ending at time t3, the threshold voltage decreases slightly, but continues to increase during the following erase cycle. By the time t6, transistor 32 appears to be in the erased, non-conductive, state similar to transistor 33.

Transistor 33 sees a negative degradation of its threshold voltage when programming voltage is applied to control gate wordline 0. The voltage on transistor 33 begins at the erase threshold voltage level as indicated in FIG. 4, but has decreased below that level at the end of time period t1. During the second time period from time t1 to time t2, an erase voltage of +12 volts is applied to control gate wordline 0. During this time, the degradation experienced by transistor 33 is recovered as the threshold voltage on transistor 33 increases back to the erase threshold voltage level. Note that transistor 33 was in the erased state prior to the write operation and the degradation was only produced as a programming voltage was applied to the control gate wordline 0 which is coupled to the control gate of transistor 33. Transistor 33 is to be erased at the end of this write operation and therefore it is desirable that we see little to no degradation of the voltage on transistor 33.

During time period t2, transistor 30 sees an increase in threshold voltage as does transistor 31. Transistor 32 sees a drastic increase as the threshold voltage on transistor 32 changes away from the programming threshold voltage level toward the erase voltage level. Note that according to the present embodiment, programming and erase voltages are applied sequentially to control gate wordline 0 in cycles. A first cycle of programming voltages experienced up until time t1, an erase cycle up until time t2, a programming cycle from time t2 to t3, an erase cycle from time t3 to t4, etc. As the write operation continues through the different cycles, transistor 30 and transistor 33 see small changes in the voltage on each. However, transistors 30 and 33 are to maintain their respective states. Transistors 31 and 32 are to change their respective states, where each one began in a first state and are to be written to another state.

Figure 5:
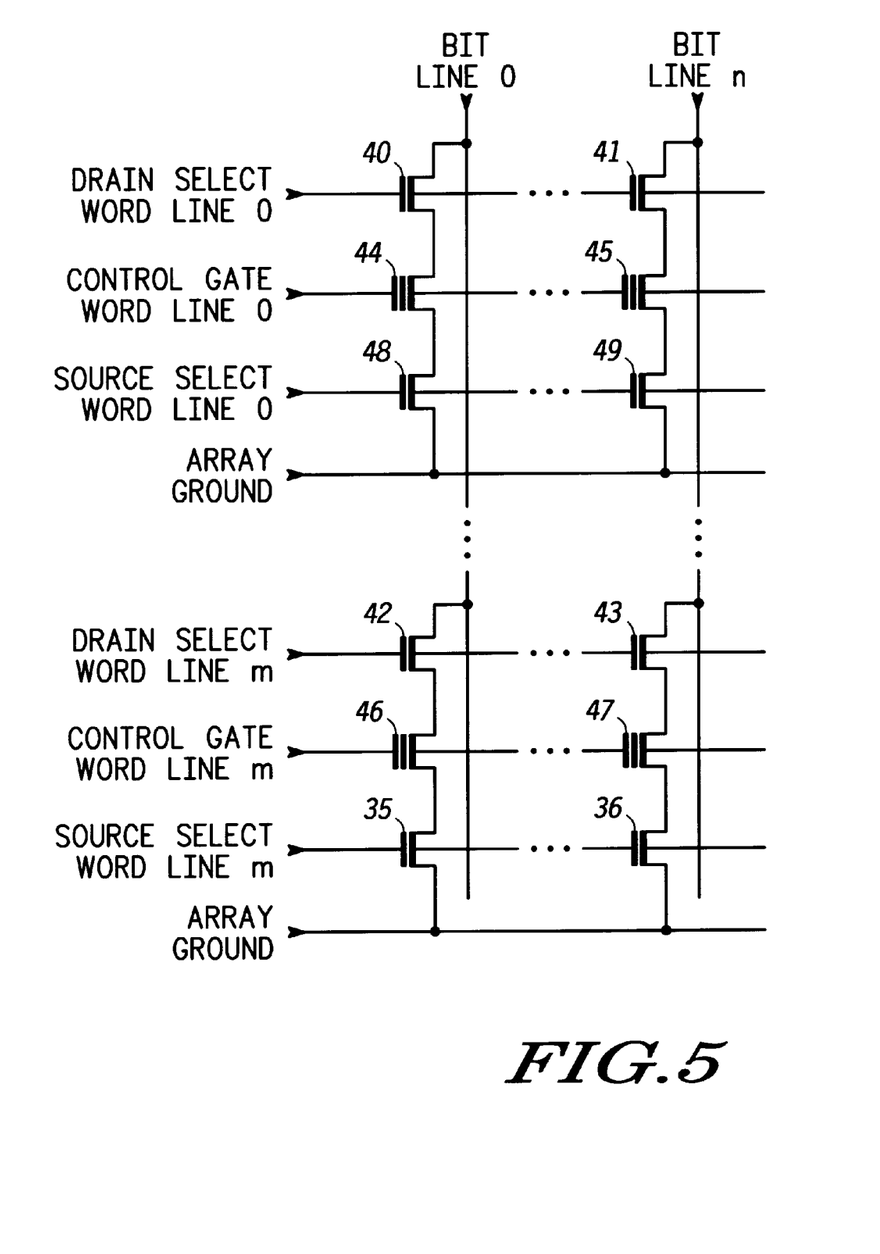
FIG. 5 illustrates, in circuit diagram form, a three-transistor memory array according to one embodiment of the present invention.

FIG. 5 illustrates another embodiment of the present invention, where the memory device includes three transistors. For clarity, the following discussion will focus on transistors 40, 44, and 48, however a similar discussion will apply to transistors 41, 45, and 49 or transistors 42, 46, and 35, or transistors 43, 47, and 36. The data for the memory cell is stored on transistor 44, a floating gate transistor, which is coupled to the control gate wordline 0. The memory cell then includes transistor 40, where the gate of transistor 40 is coupled to a drain select wordline 0 and the drain node of transistor 40 is coupled to bitline 0. Additionally, the memory cell includes transistor 48 which has a gate coupled to source select wordline 0. Note that the source of transistor 48 is coupled to the common array ground. The common array ground is coupled to the source nodes of transistors 48 through 49 and 35 through 36. In this memory device, bitline 0 is coupled to the drain node of transistors 40 through 42. Bitline n is coupled to the drain node of transistors 41 through 43. Bitlines are thus connected to multiple wordlines.

During a write to the memory cell including transistor 44, the present method will select wordline 0 and will de-select all of the other wordlines in the memory array. To do this, drain select wordline 0 is held to a high voltage level. Drain select wordline m is then held at a low voltage level. The data to be written into the memory cell is provided on bitline 0 which is coupled to a node of transistor 40. The source node of transistor 40 is then coupled to the drain node of transistor 44. During a write to transistor 44, drain select wordline 0 is held high turning on transistor 40, which provides the data from bitline 0 to transistor 44. For a program or an erase of transistor 44, a programming voltage is first applied to control gate wordline 0 and then an erase voltage is provided. The cycles of programming voltage followed by erase voltage, or erase voltage followed by programming voltage, may be accomplished in one cycle or in multiple cycles. Note also that the time period during which the control gate wordline 0 is held at a programming voltage and the time period held at an erase voltage may be different length time periods. During a write to transistor 44, source select wordline 0 is held at a low voltage which serves to the source of floating gate device 44 from the common array ground.

Note that this same method of writing to a transistor, or a memory cell, can be accomplished with a two-transistor memory device such as that illustrated in FIG. 2. Referring again to FIG. 2, the data is input on the bitlines, and the voltage on control gate wordline 0 or control gate wordline m, according to which row is selected, is toggled between programming voltage and erase voltage.

Figure 6:
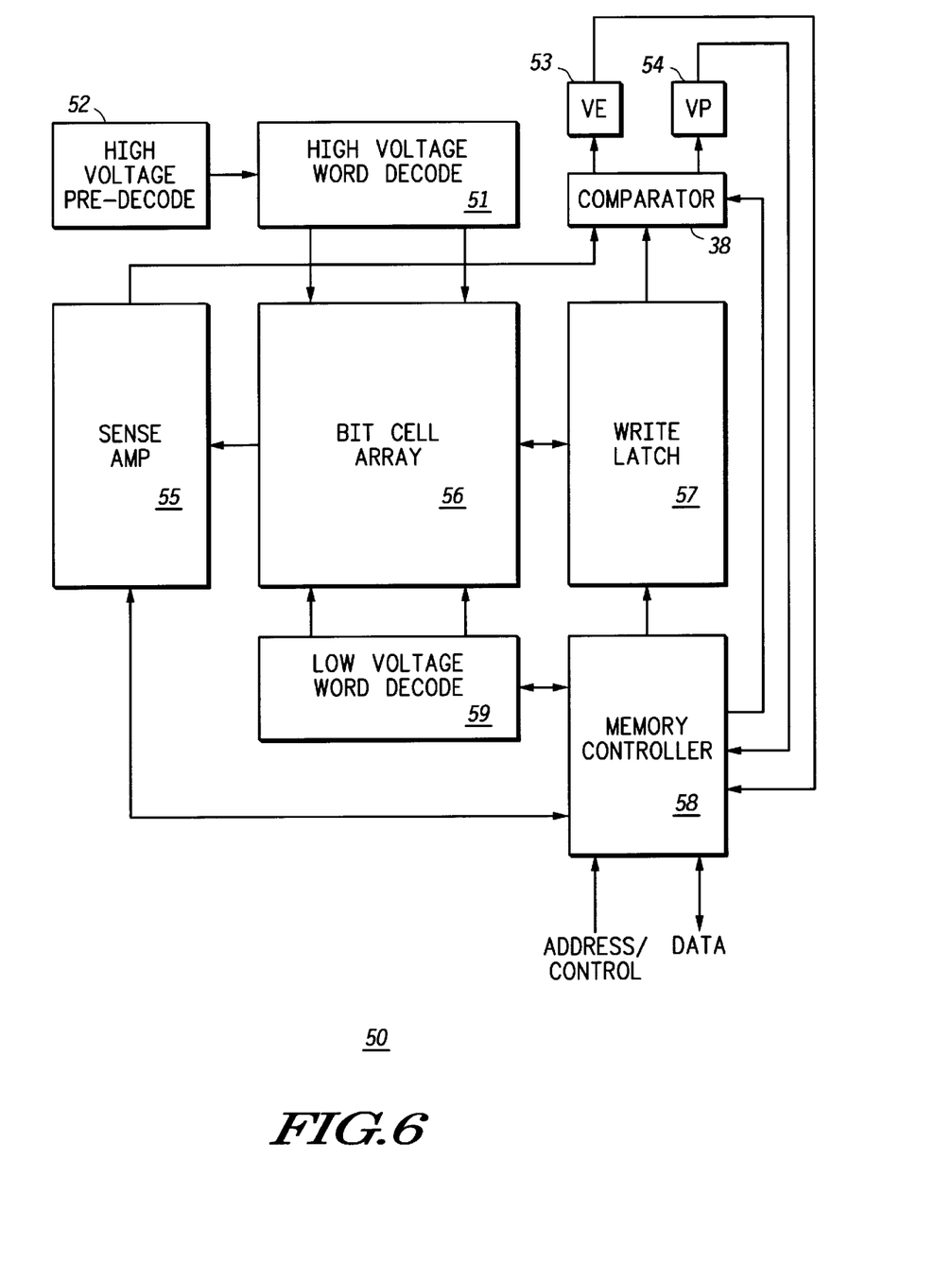
FIG. 6 illustrates, in block diagram form, a memory according to one embodiment of the present invention.

FIG. 6 illustrates an integrated memory circuit 50. Integrated memory circuit 50 could be part of a data processing system which includes a non-volatile erasable memory. Here memory controller 58 controls operation of a memory array illustrated as bit cell array 56. Bit cell array 56 is coupled to a write latch 57 and to word decoders 51 and 59, as well as sense amplifier 55, labeled sense amp. Data stored in bit cell array 56 is compared with data stored in write latch 57 by comparator 38. According to one embodiment of the present invention, data stored in bit cell array 56 is provided to comparator 38 by way of sense amplifier 55. According to one embodiment of the present invention, a control gate wordline voltage is provided by high voltage word decode 51 and a select line is provided by low voltage word decode 59. According to an alternate embodiment having a three-transistor memory implementation, a drain select wordline is provided by low voltage word decode 59 and a control gate wordline is provided by high voltage word decode 51.

A high voltage pre-decode 52 is coupled to high voltage word decode 51, which is in turn coupled to bit cell array 56. Sense amplifier 55 is coupled to comparator 38 and bidirectionally coupled to memory controller 58. Memory controller 58 receives address and control information as well as data information from within integrated memory circuit 50 and may receive such information from within a data processing system. Memory controller 58 is bidirectionally coupled to low voltage word decode 59. Memory controller 58 provides new data information to write latch 57, where the new data is stored in write latch 57 to be written into bit cell array 56. Memory controller 58 is coupled to storage units 53 and 54, as well as comparator 38. The coupling illustrated in FIG. 6 is implemented by way of multiple conductors, where uni-directionality and bi-directionality is indicated by arrows.

Memory controller 58 controls accesses to bit cell array 56 including write operations. Bit cell array 56 includes a plurality of memory rows, each accessed by a wordline in combination with a plurality of bitlines. For a write operation to a row in bit cell array 56, memory controller 58 indicates the appropriate control gate wordline to be asserted and data from write latch 57 is used to provide voltage levels on the bitlines for that row. Comparator 38 then provides a signal verify erase (VE), and a signal verify program (VP) as output indications of the comparison between data stored in bit cell array 56 and data stored in write latch 57. The output signals VE and VP may be stored in a register, as illustrated in FIG. 6, where data storage 53 stores the VE information and data storage 54 stores the VP information. The verify erase and verify program information is provided to memory controller 58 which uses this information to make decisions regarding further actions to be performed in order to accomplish the desired write operation.

Memory controller 58 may decide to perform another program cycle or another erase cycle. Additionally, memory controller 58 may increase or decrease the programming and/or erase time, or adjust the programming and/or erase voltages to effectively program bit cell array 56. In alternate embodiments, memory controller 58 decides the size of the block to be erased. Memory controller 58 may also detect defective cells, where programming or erase time is above a given value, and the memory cells are not to be used. Memory controller 58 may adjust the programming and/or erase time in response to conditions within integrated memory circuit 50 or within a data processing system.

Figure 7:
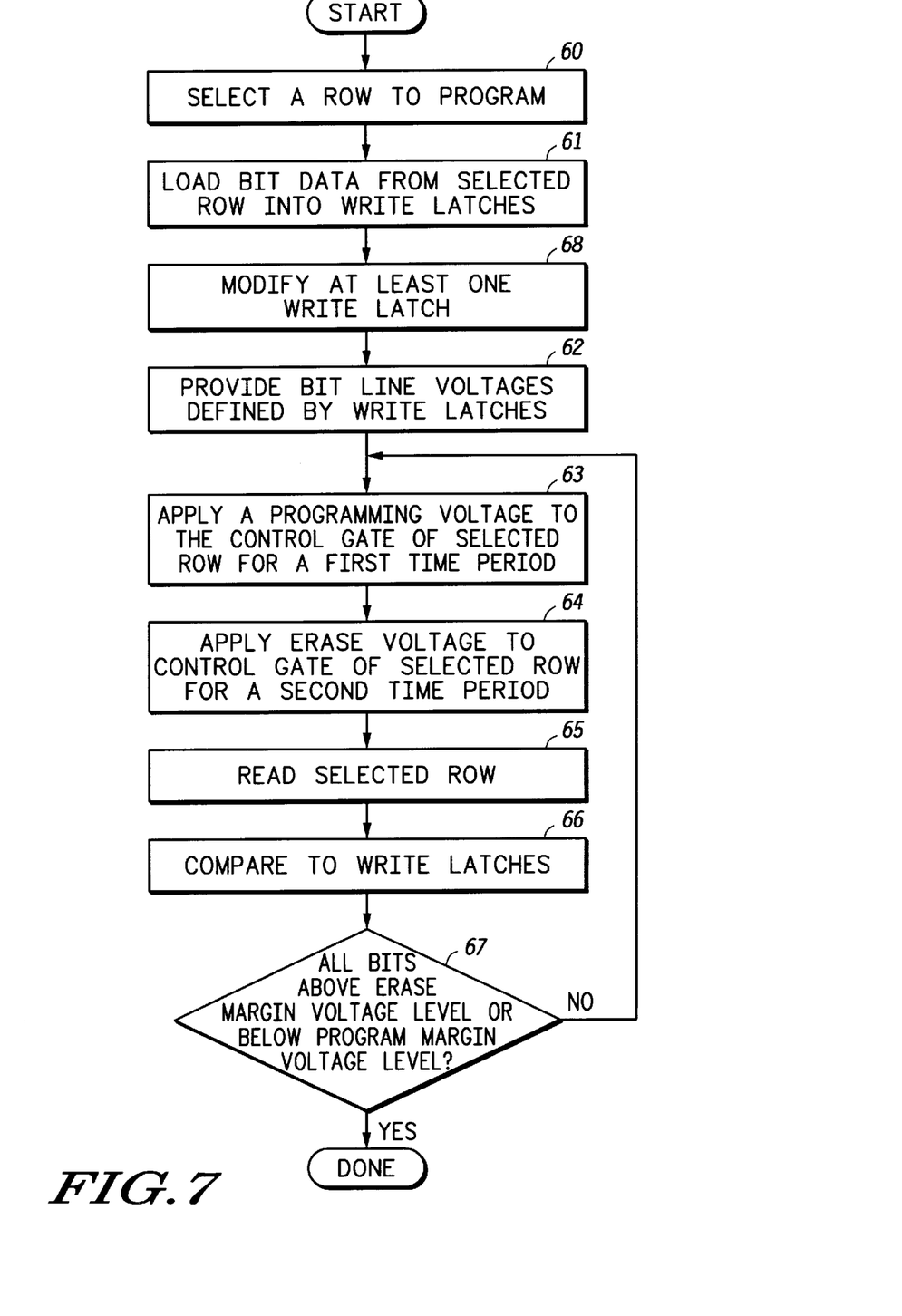
FIGS. 7 and 8 illustrate, in flow diagram form, a method of writing to a memory according to alternate embodiments of the present invention.

FIG. 7 illustrates a process flow for a write operation according to one embodiment of the present invention. Process flow starts by selecting a wordline for writing at process block 60; a wordline may also be referred to as a row of data. The write to the selected wordline may be to program bits or erase bits consistent with data stored in the write latch 57. Where the write latch 57 contains a logical "0" the bit is to be erased, and where the write latch 57 contains a logical "1" the bit is to be programmed. Continuing to process block 61, bit data from the selected row is loaded into the write latches, illustrated in FIG. 6 as write latch 57. At process block 68 data in write latch 57 is modified to indicate data to be written to a row in bit cell array 56. At process block 62 memory controller 58 provides bitline voltages as defined by the information stored in write latch 57. Continuing to process block 63, a programming voltage is applied to the control gate wordline of the selected row for a first time period. At process block 64 an erase voltage is provided to the control gate wordline of the selected row for a second time period. Note that the first time period and the second time period may be a same time period. Note also that the first time period and the second time period may be adjusted according to processing parameters, the size of the memory, or other circuit design concerns.

At process block 65, the selected row is then read by providing the data into sense amplifier 55 of FIG. 6. Referring again to FIG. 7, at process block 66 the data from bit cell array 56 is compared to the data in the write latch 57. This comparison is done by comparator 38 of FIG. 6. At decision diamond 67, it is determined whether all bits in the selected row of bit cell array 56 are within a margin value of the data stored in write latch 57. If all bits are either above the erase margin threshold voltage level or below the program margin threshold voltage level then the process ends. However, if any bit falls between the two margin threshold voltage levels then process flow continues to process block 63 where the cycles of programming voltage and erase voltage are again applied.

Figure 8:
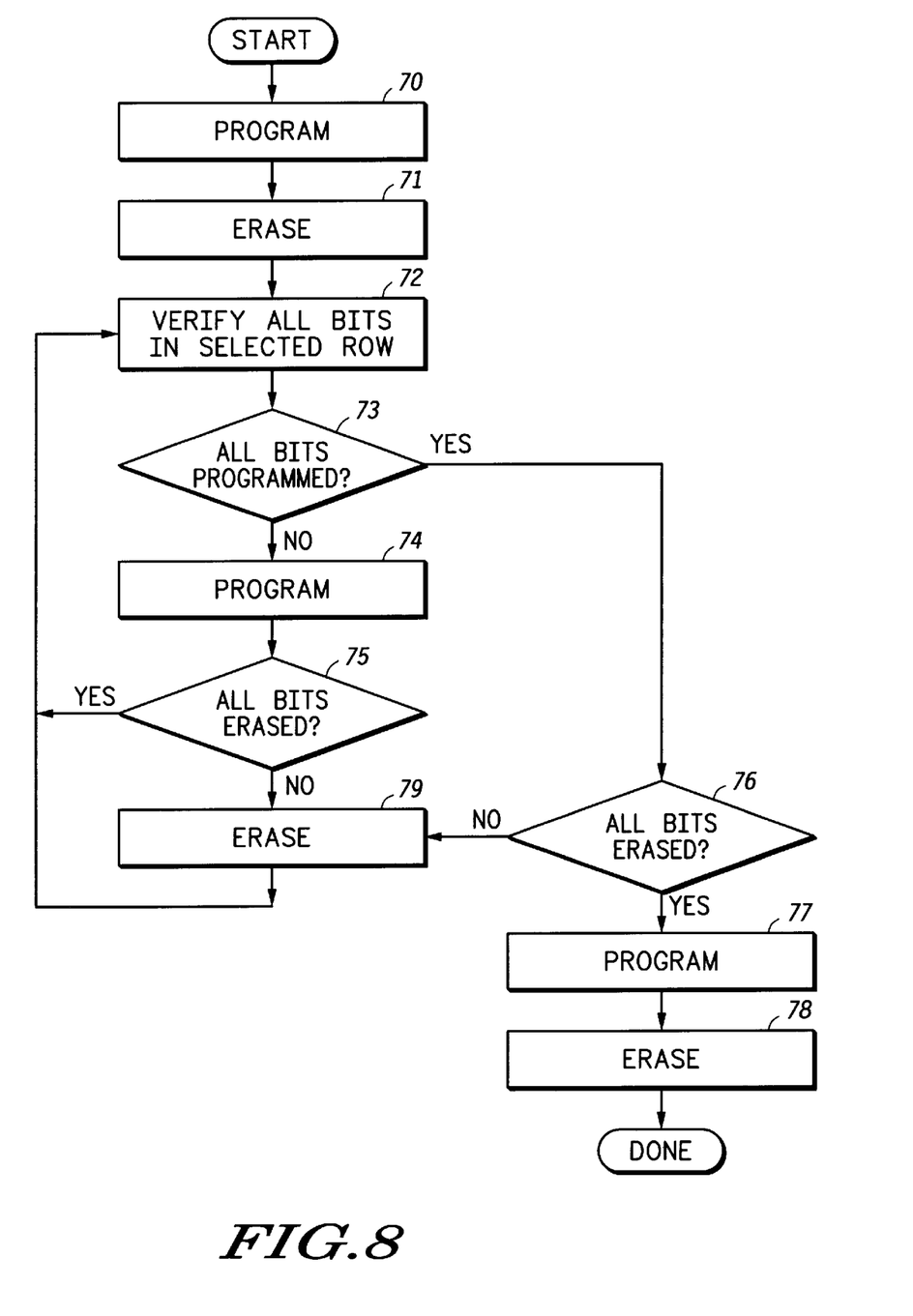

FIG. 8 illustrates an alternate embodiment of the present invention, where a program illustrated at process block 70 indicates the programming cycle of block 63 of FIG. 7. Here, a programming voltage is again applied to a control gate wordline of a selected row. Processing continues to process block 71 where the erase cycle corresponds to the erase cycle of process block 64 of FIG. 7. Here, an erase voltage is applied to the control gate wordline of a selected row. Again, the time periods for applying the programming voltage and the erase voltage may be adjusted according to a number of parameters, or may be set to a predetermined value. At process block 72, the process verifies all bits in the selected row. This verification process is similar to process blocks 65 and 66 in FIG. 7, where data is read from the selected row and then compared to data stored in write latch 57.

At decision diamond 75, it is determined if all bits are erased. This refers to a comparison of those bits that are intended to be erased as determined by the data stored in write latch 57. If all of the bits to be erased have not been erased, the process flow continues to another erase cycle as indicated at process block 79, which is similar to that performed at process block 71. On the completion of the erase cycle of process block 79, processing flow continues to process block 72 to verify all bits in the selected row. If all bits are erased at decision diamond 75, processing flow continues to block 72. From block 72 processing flow continues to decision diamond 73 to determine if all bits have been programmed. This verifies that all bits indicated for programming by the data stored in write latch 57 have actually been programmed in bit cell array 56. If all bits have been programmed, processing continues to decision diamond 76 to determine if all bits have been erased. This is similar to the verification of decision diamond 75. If all bits have been erased, processing continues to block 77 for one final programming cycle and to block 78 for one final erase cycle before completion. However, at decision diamond 76, if all bits have not been erased, processing continues to an erase cycle at block 79.

In this way, either a failure to erase or a failure to program will trigger another cycle of application of a voltage to the control gate wordline. The mode of failure determines the voltage level applied as well as the length of time it is applied. When a bit fails to erase, another erase cycle is performed. When a bit fails to program, another programming cycle is performed. According to one embodiment of the present invention, upon completion of the write operation, when all bits are correctly written, one more programming cycle and one more erase cycle are performed. This is to further reinforce the write operation.

Figure 9:
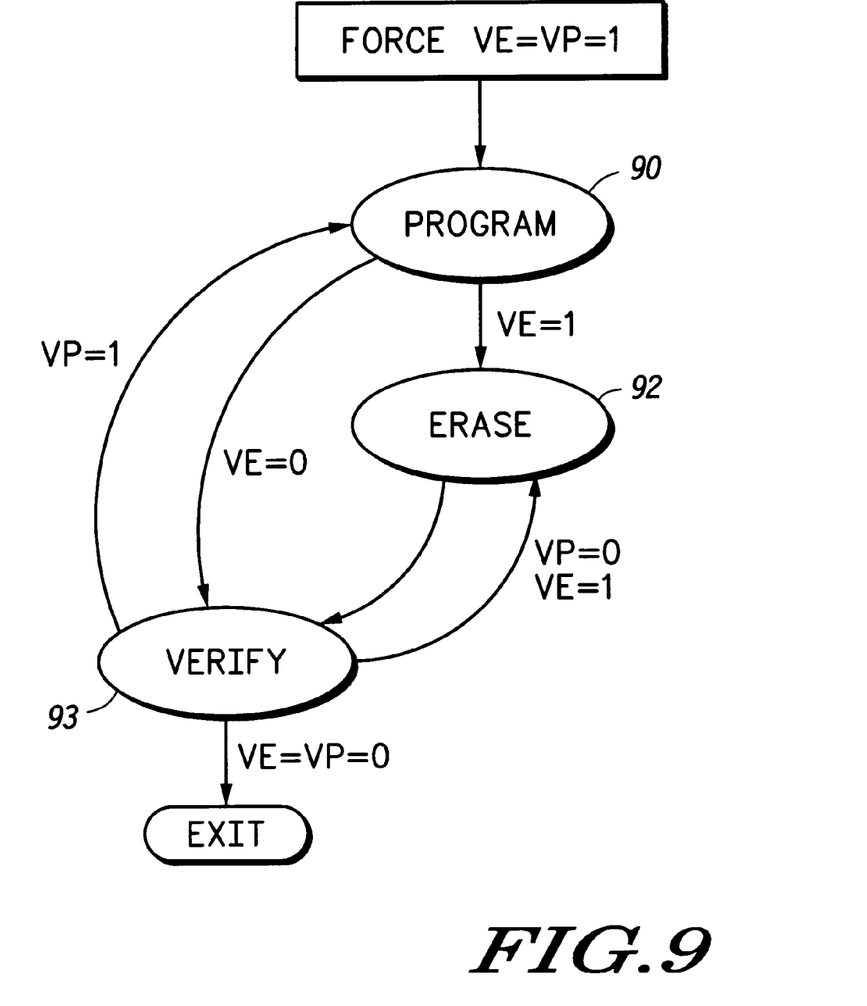
FIG. 9 illustrates, in state diagram form, operation of memory controller 58 of FIG. 6 according to one embodiment of the present invention.

FIG. 9 illustrates, in state diagram form, the operation of memory controller 58 of FIG. 6. Initiation of a write operation in cell array 56, VE and VP are forced to a predetermined value. According to the present embodiment, VE and VP are asserted when programming and erase are not verified. Note that in alternate embodiments an opposite logical assignment may be made. Forcing VE and VP to a logical "1" initiates a programming cycle or programming state at state 90. Upon completion of the programming cycle, if VE is still at a logical value of "1", an erase cycle is initiated at state 92. However, if after the programming cycle of state 90, VE is cleared, memory controller 58 transitions to state 93 for verification.

Continuing with state 92, an erase cycle is performed. At the completion of the erase cycle, memory controller 58 transitions to verify state 93. At the completion of verify of state 93, if VP is cleared and VE is set, memory controller 58 transitions to state 92 for another erase cycle. In this case, at least one bit was not erased while all bits to be programmed were programmed. At the completion of verify state 93, if VE and VP are both cleared, the write operation is complete. However, if VP is set, memory controller 58 transitions back to programming of state 90. Upon completion of the programming cycle at state 90, if VE is cleared, memory controller 58 transitions to verify state 93. States 90 and 92 do not verify the write operation and do not update VE or VP. VE and VP are only updated upon completion of verification at state 93.

According to one embodiment, a method for writing to a bit of a non-volatile memory is provided whereby programming and erase voltages are alternately applied to the control gate wordline of a selected wordline. A write includes programming and erasing of bits in the memory array. Upon completion of the write operation a verify erase (VE) indication and a verify program (VP) indication are provided to a memory controller, which then determines if multiple cycles are necessary. The configuration of the memory cell allows isolation of each bit in the memory array to avoid effects of writes to neighbor bits. According to one embodiment, a three transistor EEPROM is written by providing a high voltage to the drain select of the selected wordline, while providing a low voltage to the drain select of other wordlines. Programming and erase voltages are applied to the control gate wordline of the selected wordline in cycles until the write is complete.

According to one embodiment of the present invention, a memory array including two transistor memory cells is programmed and erased in a manner similar to the method of the three transistor memory cell. Programming and erase voltages are alternately applied to the control wordline, but there is no drain select transistor. Referring to FIG. 6, memory controller 58 operates as indicated in FIG. 9. The methods illustrated in FIGS. 7 and 8 are applicable to such a memory array.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An integrated circuit, comprising:
   a memory array having a plurality of rows, the plurality of rows having a plurality of memory cells;
   a write latch unit coupled to the memory array, the write latch storing data to be written into the memory array;
   a comparator coupled to the memory array and to the write latch unit, the comparator comparing data stored in a first row of the plurality of rows to data stored in the write latch unit and in response providing a verify erase signal and a verify program signal;
   a memory controller coupled to the memory array and the write latch unit, the memory controller initiating application of a programming voltage to a wordline coupled to the first row when the verify program signal is at a first value, the memory controller initiating application of an erase voltage to the wordline coupled to the first row when the verify erase signal is at a second value.

2. The integrated circuit of claim 1, further comprising:
   a sense amplifier circuit coupled between the memory array and the comparator, the sense amplifier providing data stored in the first row to the comparator.

3. The integrated circuit of claim 1, wherein the verify program signal and the verify erase signal are provided to the memory controller.

4. The integrated circuit of claim 1, wherein the verify program signal is asserted on a mismatch of at least one bit to be programmed, and the verify erase signal is asserted on a mismatch of at least one bit to be erased.

5. The integrated circuit of claim 1, wherein when the verify program signal and verify erase signal indicate a mismatch between data stored in the first row and data stored in the write latch unit, the memory controller initiates sequential application of the programming voltage to the wordline coupled to the first row and application of the erase voltage to the wordline coupled to the first row.

6. The integrated circuit of claim 1, wherein each memory cell in each of the plurality of rows includes three transistors connected in series, wherein a first transistor is coupled to the wordline and a second transistor is coupled to a bitline.

7. The integrated circuit of claim 6, wherein each memory cell in the first row is coupled to a common array ground, the memory controller controlling application of a first biasing voltage to a select gate wordline coupled to the first row, wherein the first biasing voltage isolates the first transistor of each memory cell in the first row from the common array ground.

8. The integrated circuit of claim 7, wherein each of a plurality of bitlines is coupled to the first row and to a second row of the plurality of rows, the memory controller controlling application of a second biasing voltage to a first drain select wordline coupled to the first row, wherein the second biasing voltage electrically couples the first row to each of the plurality of bitlines, the memory controller controlling application of a third biasing voltage to a second drain select wordline coupled to the second row, wherein the third biasing voltage isolates the second row from each of the plurality of bitlines.

9. A method for writing to a memory array having a plurality of rows, a plurality of bitlines, and a plurality of write latches corresponding to the plurality of bitlines, comprising the steps of:
   selecting a first row in the memory array, the first row storing a first data;
   loading the first data from the first row into the plurality of write latches;
   modifying at least one of the write latches to implement a second data;
   supplying each of the plurality of bitlines with a voltage corresponding to the second data;
   applying a programming voltage to a control gate wordline coupled to the first row; and
   applying an erase voltage to the control gate wordline coupled to the first row.

10. The method as in claim 9, further comprising the steps of:
   subsequent to applying the programming and erase voltages, reading data stored in the first row;
   comparing the data stored in the first row to the second data; and
   applying at least one of the programming voltage and the erase voltage to the control gate wordline coupled to the first row.

11. The method as in claim 10, wherein the step of comparing comprises determining if the data stored in the first row is within a predetermined margin of the second data.

12. The method as in claim 9, wherein each memory cell in the first row has a first transistor coupled to the control gate wordline and a second transistor coupled to a select gate wordline, wherein each memory cell in the first row is coupled to a common array ground, the method further comprising the step of:
   supplying a first biasing voltage to the select gate wordline coupled to the first row, wherein the first biasing voltage isolates the first transistor of each memory cell in the first row from the common array ground.

13. The method as in claim 12, wherein each of the plurality of bitlines is coupled to the first row and to a second row, the method further comprising the step of:
   supplying a second biasing voltage to a first drain select wordline coupled to the first row, wherein the second biasing voltage electrically couples the first row to each of the plurality of bitlines;
   supplying a third biasing voltage to a second drain select wordline coupled to the second row, wherein the third biasing voltage isolates the second row from each of the plurality of bitlines.

14. The method as in claim 9, wherein the step of applying the programming voltage comprises:
   applying the programming voltage for a first time period; and
   wherein the step of applying the erase voltage comprises:
   applying the erase voltage for a second time period different from the first time period.

15. The method as in claim 9, wherein during the step of applying a programming voltage the common array ground is at a first voltage level; and wherein during the step of applying an erase voltage the common array ground is at a second voltage level.

16. The method as in claim 9, wherein the plurality of bitlines includes a first bitline and a second bitline, wherein the step of supplying each of the plurality of bitlines comprises the step of:
   supplying the first bitline with a negative voltage.

17. The claim as in claim 16, wherein the step of supplying each of the plurality of bitlines further comprises the step of:
   supplying the second bitline with a positive voltage.

18. The claim as in claim 16, wherein the memory array is in an isolated well, wherein the first bitline is coupled to a first transistor in the first row, wherein during the step of reading data stored in the first row the isolated well is maintained at a negative voltage.

19. A method for selecting between a program state or an erase state for each memory cell of a plurality of non-volatile memory cells all coupled to a common word line and each coupled to corresponding bit lines, comprising the steps of:
   determining which of the memory cells are to be erased and which are to be programmed;
   contemporaneously applying a bit line erase voltage to the bit lines which correspond to the memory cells which are determined to be erased and applying a bit line program voltage to the bit lines which correspond to the memory cells which are determined to be programmed; and
   alternately applying a word line erase voltage and a word line program voltage to the common word line.

* * * * *